US010609323B2

(12) United States Patent
Chen et al.

(10) Patent No.: US 10,609,323 B2
(45) Date of Patent: Mar. 31, 2020

(54) UNIVERSAL TUNING MODULE

(71) Applicant: Rafael Microelectronics Incorporation, Hsinchu County (TW)

(72) Inventors: Kuan-Ming Chen, Taichung (TW); Meng-Ping Kan, Hsinchu (TW); Hao-Yun Tang, Taipei (TW)

(73) Assignee: Rafael Microelectronics, Inc., Zhubei (TW)

( * ) Notice: Subject to any disclaimer, the term of this patent is extended or adjusted under 35 U.S.C. 154(b) by 0 days.

(21) Appl. No.: 14/287,076

(22) Filed: May 26, 2014

(65) Prior Publication Data

US 2015/0029403 A1    Jan. 29, 2015

(30) Foreign Application Priority Data

Jul. 29, 2013  (CN) ..................... 2013 2 0457563 U

(51) Int. Cl.
  *H04L 27/00*  (2006.01)
  *H03K 9/00*  (2006.01)
  *H04N 5/50*  (2006.01)
  *H04N 21/426*  (2011.01)

(52) U.S. Cl.
  CPC ................. *H04N 5/50* (2013.01); *H03K 9/00* (2013.01); *H04L 27/00* (2013.01); *H04N 21/42638* (2013.01)

(58) Field of Classification Search
  CPC .. H03D 3/22; H03H 7/30; H03H 7/40; H03K 5/159; H03K 9/00; H04N 5/50; H04N 5/44; H04N 5/445; H04N 21/42638

USPC ......... 348/731, 725, 726, 552–553; 375/316, 375/332, 347, 322, 344
  See application file for complete search history.

(56) References Cited

U.S. PATENT DOCUMENTS

| | | | |
|---|---|---|---|
| 4,939,789 A | 7/1990 | Sakashita et al. | |
| 5,774,194 A | 6/1998 | Armbruster | |
| 5,959,592 A * | 9/1999 | Petruzzelli | H01Q 1/247 343/756 |
| 7,038,733 B2 * | 5/2006 | Dent | H04N 5/21 348/614 |
| 7,425,995 B2 * | 9/2008 | Johnson | H03C 3/403 348/725 |
| 7,675,996 B2 * | 3/2010 | Johnson | H03D 7/00 375/316 |
| 7,773,967 B2 * | 8/2010 | Smith | H04B 1/30 455/114.1 |
| 7,978,735 B2 * | 7/2011 | Ezra | H04L 12/2801 370/493 |
| 8,254,499 B2 * | 8/2012 | Ikeda | H03J 7/18 375/279 |
| RE44,551 E * | 10/2013 | Abdelgany | H03D 3/007 348/731 |

(Continued)

FOREIGN PATENT DOCUMENTS

EP    0276144    11/1993

*Primary Examiner* — Trang U Tran

(57) ABSTRACT

A universal tuning module may include an oscillator, a first tuner configured to process a first television signal, a second tuner configured to process a second television signal, a first switch configured to pass its input containing information associated with an output of the oscillator to said first tuner, and a second switch configured to pass its input containing information associated with the output of the oscillator to the second tuner.

12 Claims, 7 Drawing Sheets

(56) References Cited

U.S. PATENT DOCUMENTS 8,885,106 B2 * 11/2014 Koroglu ............... H04N 5/4401
  348/555
9,036,091 B2 * 5/2015 Hendrickson ............ H04N 5/46
  348/725

* cited by examiner

UNIVERSAL TUNING MODULE

This application claims priority of China Patent Application No. 201320457563.4, filed on Jul. 29, 2013, the entirety of which is incorporated herein by reference.

BACKGROUND OF THE DISCLOSURE

Field of the Disclosure

The present invention relates generally to a universal tuning module, and more particularly to a universal tuning module configured to pass a clock signal from an oscillator to a hybrid tuner or a satellite tuner.

Brief Description of the Related Art

With the advances in communication technology, a global television broadcasting system has gradually developed into a digital mode. A tuner plays an important role in a digital television, set-top box and future receiving system.

FIG. 1 is a block diagram of a traditional receiving system for a digital television. Referring to FIG. 1, the traditional receiving system includes a first tuner 10, second tuner 11, first receiving terminal 12, second receiving terminal 13, demodulator 14 and liquid-crystal-display (LCD) panel 15, wherein the first tuner 10, second tuner 11 and demodulator 14 are three integrated circuit chips arranged individually. The first receiving terminal 12 is configured to receive a first television signal. The second receiving terminal 13 is configured to receive a second television signal. The first tuner 10 processes the first television signal received by the first receiving terminal 12 to generate an intermediate-frequency (IF) signal. The second tuner 11 processes the second television signal received by the second receiving terminal 13 to generate a set of orthogonal signals. The intermediate-frequency (IF) signal and the set of orthogonal signals may be transmitted to the liquid-crystal-display (LCD) panel 15 for displaying them. The two tuners lead complex circuits with interference.

SUMMARY OF THE DISCLOSURE

The present invention provides a universal tuning module to pass a clock signal from an oscillator to a hybrid tuner or a satellite tuner.

The universal tuning module may include an oscillator, a first tuner configured to process a first television signal, a second tuner configured to process a second television signal, a first switch configured to pass its input containing information associated with an output of the oscillator to said first tuner, and a second switch configured to pass its input containing information associated with the output of the oscillator to the second tuner.

In an embodiment, when the first switch is switched on to pass the its input to the first tuner, the second switch is switched off not to pass the its input to the second tuner. When the second switch is switched on to pass the its input to the second tuner, the first switch is switched off not to pass the its input to the first tuner.

In an embodiment, the universal tuning module may further include a phase-lock-loop (PLL) circuit arranged upstream of the first and second switches and downstream of the oscillator, wherein the phase-lock-loop (PLL) circuit is configured to generate a clock signal with a frequency substantially equal to a multiple of that of the output of the oscillator or to generate a clock signal, based on the output of the oscillator, with any frequency that the first or second tuner needs.

In an embodiment, the first and second tuners, the first and second switches, and the phase-lock-loop (PLL) circuit may be incorporated in an integrated circuit chip, and the oscillator is not incorporated in the integrated circuit chip.

In an embodiment, the first and second tuners, the first and second switches, the oscillator and the phase-lock-loop (PLL) circuit are incorporated in a common integrated circuit chip.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

Figure 1:
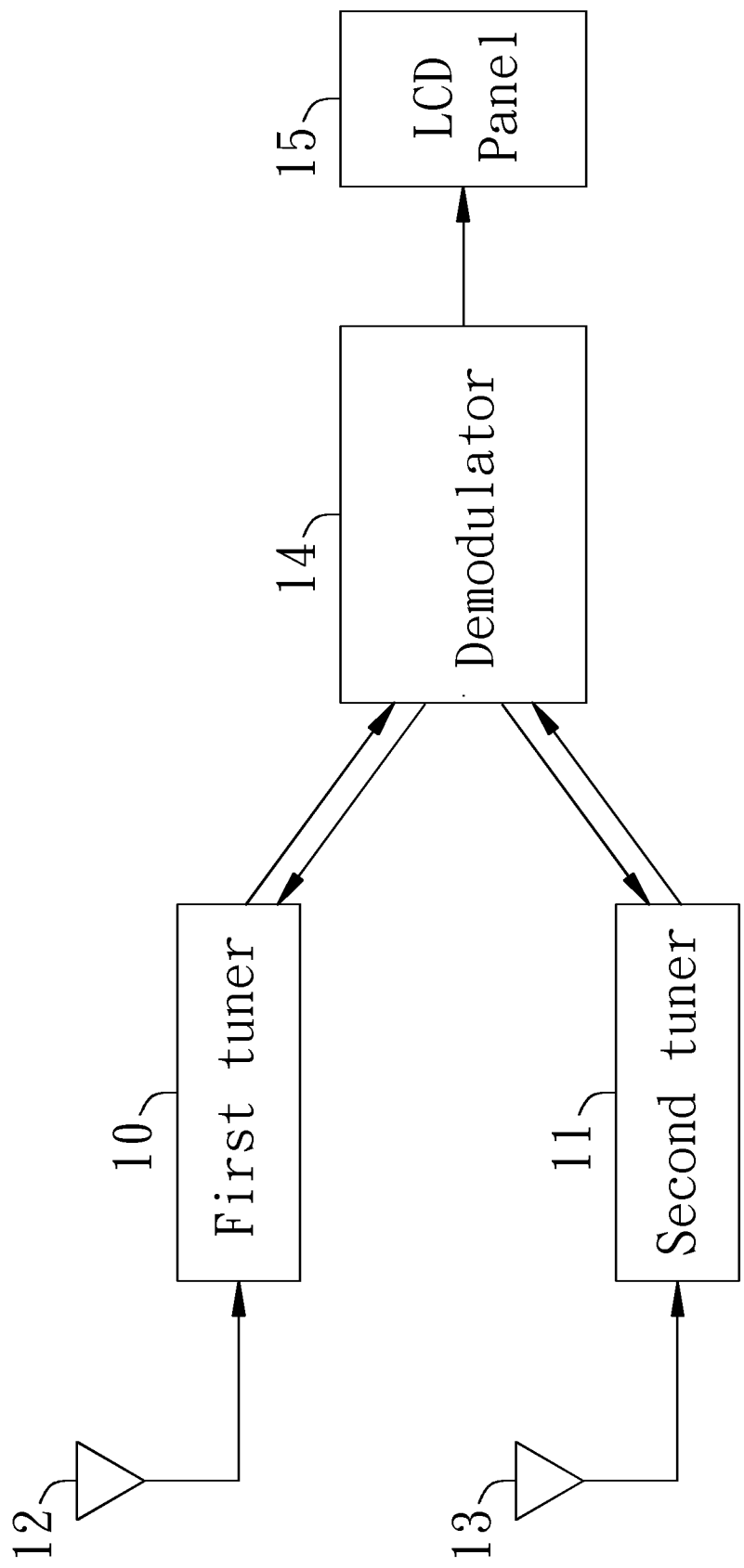
FIG. 1 is a block diagram of a traditional receiving system for a digital television.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE INVENTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Figure 2:
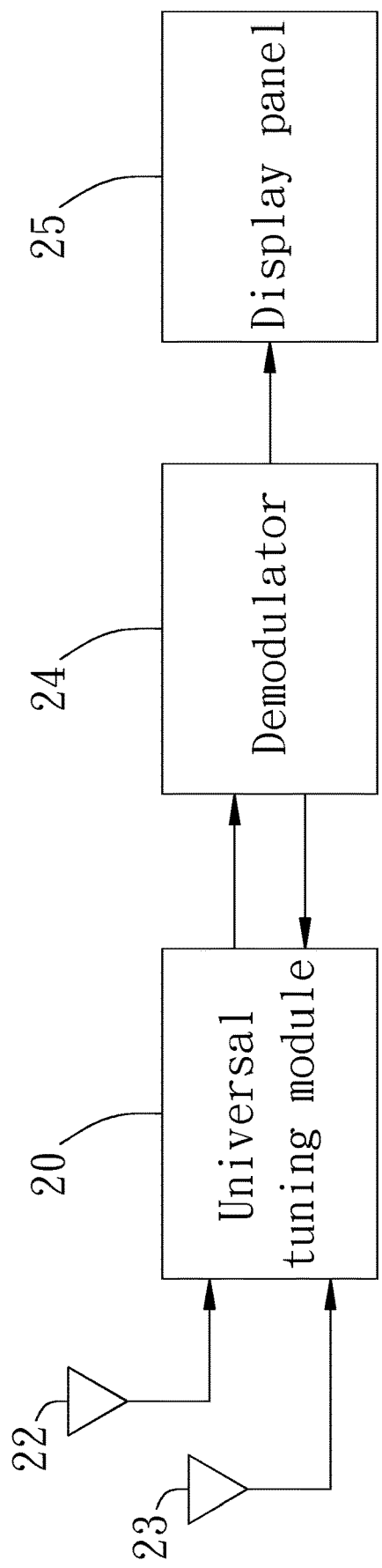
FIG. 2 illustrates a block diagram of a television and satellite receiving system in accordance with an embodiment of the present invention.

FIG. 2 illustrates a block diagram of a television and satellite receiving system in accordance with an embodiment of the present invention. Referring to FIG. 2, the television and satellite receiving system may include a receiving terminal 22, such as very-high-frequency (VHF) antenna or ultra-high-frequency (UHF) antenna, for receiving a first signal, i.e. digital or analog television signal having a frequency band, for example, between 42 MHz and 1002 MHz, and a receiving terminal 23 provided with a reflector or reflecting disk and a feed or horn arranged at a focus of the reflector or reflecting disk, wherein the feed or horn may receive a second signal, i.e. digital television signal having a frequency band, for example, between 950 MHz and 2150 MHz, reflected by the reflector and transmitted from a-satellite. The television receiving system may further include a universal tuning module 20 arranged downstream of the receiving terminals 22 and 23 and configured to tune the first signal received from the receiving terminal 22 and/or tune the second signal received from the receiving terminal 23. The television and satellite receiving system may further include a demodulator 24, provided by an integrated circuit chip, coupled to the universal tuning module 20 and configured to demodulate the first signal and/or second signal tuned by the universal tuning module 20. The television and satellite receiving system may further include a display panel 25, such as liquid-crystal-display (LCD) panel, coupled to the demodulator 24 and configured to display the first signal and/or second signal demodulated by the demodulator 24.

Figure 3:
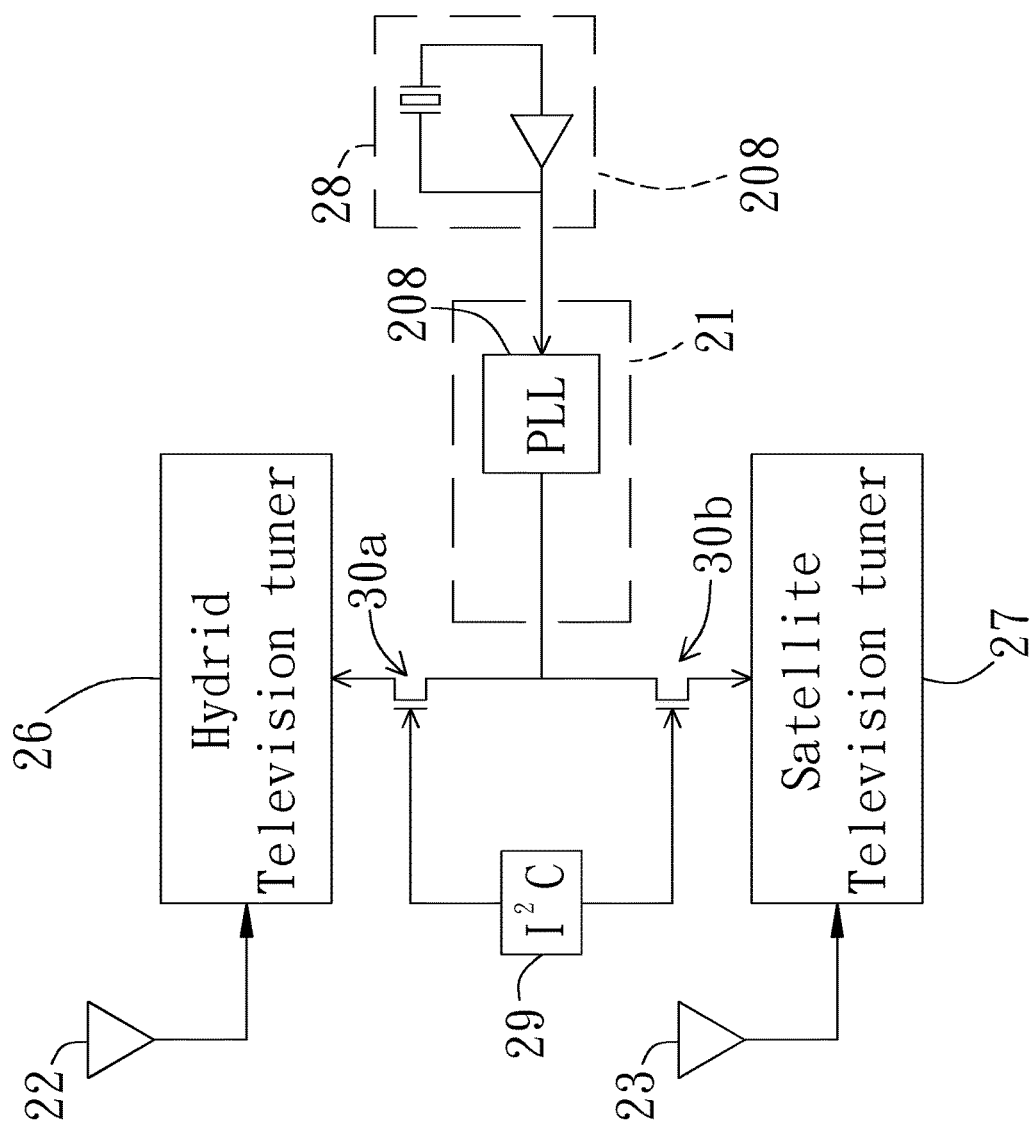
FIG. 3 is a block diagram illustrating a universal tuning module of the television and satellite receiving system and components of a local oscillating module of the universal tuning module in accordance with an embodiment of the present invention.

FIG. 3 illustrates a block diagram of a universal tuning module of the television and satellite receiving system and components of a local oscillating module of the universal tuning module in accordance with an embodiment of the present invention. Referring to FIGS. 2 and 3, the universal tuning module 20 may include a hybrid television tuner 26 configured to tune the first television signal transmitted from the receiving terminal 22 and a satellite television tuner 27 configured to tune the second television signal transmitted from the receiving terminal 23.

Referring to FIG. 3, the universal tuning module 20 may include an external oscillator 28, which may be provided with a quartz crystal, configured to generate a reference clock signal at an output of the external oscillator 28. Alternatively, the external oscillator 28 may be provided with an RLC circuit, composed of resistors, inductors and capacitors, without any quartz crystal.

Referring to FIG. 3, the universal tuning module may include a frequency synthesizer 21 arranged upstream of the hybrid television tuner 26 and satellite television tuner 27 and downstream of the external oscillator 28. The frequency synthesizer 21 may include a phase-lock-loop (PLL) circuit 208 having an input coupled to the reference clock signal generated from the external oscillator 28. The phase-lock-loop (PLL) circuit 208 is configured to generate a synthesized clock signal with a frequency substantially equal to a multiple of that of its input or to generate a clock signal, based on its input, with any frequency that the hybrid television tuner 26 or satellite television tuner 27 needs, wherein the frequency of the synthesized clock signal may be controlled by a voltage or current at an input (not shown) of the phase-lock-loop (PLL) circuit 208.

Referring to FIGS. 2 and 3, the universal tuning module 20 may further include a switch 30a arranged downstream of the phase-lock-loop (PLL) circuit 208 and upstream of the hybrid television tuner 26 and a switch 30b arranged downstream of the phase-lock-loop (PLL) circuit 208 and upstream of the satellite television tuner 27. The switch 30a is arranged in parallel with the switch 30b. The switch 30a may have an input coupled to the synthesized clock signal configured to be passed by the switch 30a from the phase-lock-loop (PLL) circuit 208 to the hybrid television tuner 26. The switch 30b may have an input coupled to the synthesized clock signal configured to be passed by the switch 30b from the phase-lock-loop (PLL) circuit 208 to the satellite television tuner 27. The universal tuning module 20 may further include an inter-integrated circuit ($I^2C$) 29 configured to generate a first control signal based on instructions from the demodulator 24 to the switch 30a so as to control the switch 30a to be switched on to pass the synthesized clock signal from the phase-lock-loop (PLL) circuit 208 to the hybrid television tuner 26 or to be switched off not to pass the synthesized clock signal from the phase-lock-loop (PLL) circuit 208 to the hybrid television tuner 26, and configured to generate a second control signal based on instructions from the demodulator 24 to the switch 30b so as to control the switch 30b to be switched on to pass the synthesized clock signal from the phase-lock-loop (PLL) circuit 208 to the satellite television tuner 27 or to be switched off not to pass the synthesized clock signal from the phase-lock-loop (PLL) circuit 208 to the satellite television tuner 27. When the switch 30a is switched on to pass the synthesized clock signal to the hybrid television tuner 26, the switch 30b is switched off not to pass the synthesized clock signal to the satellite television tuner 27. When the switch 30a is switched off not to pass the synthesized clock signal to the hybrid television tuner 26, the switch 30b is switched on to pass the synthesized clock signal to the satellite television tuner 27.

Figure 4:
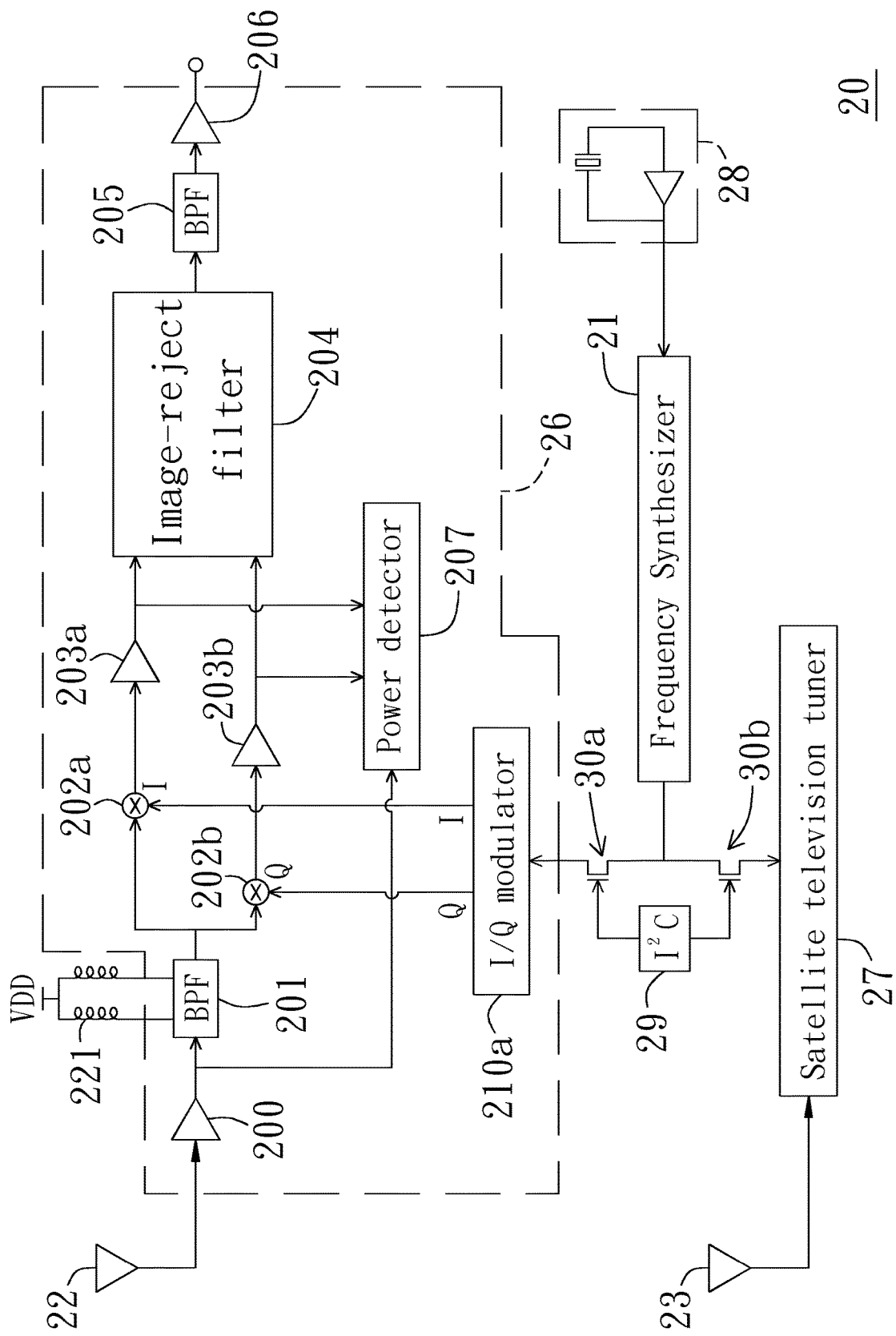
FIG. 4 is a block diagram illustrating the universal tuning module and components of the hybrid television tuner in accordance with an embodiment of the present invention.

FIG. 4 is a block diagram illustrating the universal tuning module and components of the hybrid television tuner in accordance with an embodiment of the present invention. Referring to FIGS. 3 and 4, the hybrid television tuner 26 may include (1) a low noise amplifier 200, e.g. single-ended-to-differential amplifier, arranged downstream of the receiving terminal 22, (2) a band-pass filter (BPF) 201 arranged downstream of the amplifier 200, (3) a pair of mixers 202a and 202b, i.e. frequency-down converters, arranged in parallel and downstream of the band-pass filter (BPF) 201, (4) a pair of variable-gain amplifiers (VGA) 203a and 203b, e.g. differential-to-differential amplifiers, arranged in parallel and downstream of the pair of mixers 202a and 202b respectively, (5) an image reject filter 204 arranged downstream of the pair of amplifiers 203a and 203b, (6) a band-pass filter (BPF) 205 arranged downstream of the image reject filter 204, (7) a variable-gain amplifier 206, e.g. differential-to-differential amplifier, arranged downstream of the band-pass filter (BPF) 205, (8) a modulator 210a, e.g. in-phase and quadrature (I/Q) modulator, arranged downstream of the switch 30a and upstream of the pair of mixers 202a and 202b, and (9) a power detector 207 having multiple inputs coupled respectively to outputs of the amplifiers 200, 203a and 203b.

Referring to FIG. 4, the low noise amplifier 200 may have an input coupled to the first television signal transmitted from the receiving terminal 22 and is configured to amplify its input into an output, e.g. differential output with a phase difference of substantially 180 degrees to each other, of the amplifier 200. The band-pass filter 201 may have an input, e.g. differential input, coupled to the output of the amplifier 200 and is configured to pass its input at frequencies within a first radio-frequency (RF) band, i.e. RF-1, ranging from 20

MHz to 2000 MHz and preferably ranging from 42 MHz to 1002 MHz, for example, and attenuate its input at frequencies outside the first radio-frequency (RF) band, i.e. RF-1, into an output, e.g. differential output, of the band-pass filter 201. The universal tuning module may further include multiple inductors 221 coupled between a power source VDD and the band-pass filter 201 so as to reduce interference signals.

Referring to FIGS. 3 and 4, the modulator 210a may have an input coupled to the output of the phase-lock-loop (PLL) circuit 208 of the frequency synthesizer 21 through the switch 30a and is configured to modulate the synthesized clock signal generated by the phase-lock-loop (PLL) circuit 208 and passed by the switch 30a into a first pair of mixing clock signals, e.g. in-phase and quadrature (I/Q) modulated signals, at a pair of outputs of the modulator 210a. The first pair of mixing clock signals may be transmitted from the modulator 210a to the respective mixers 202a and 202b. The first pair of mixing clock signals may have substantially the same frequency as that of the synthesized clock signal generated by the phase-lock-loop (PLL) circuit 208 and passed by the switch 30a and have a phase difference of substantially 90 degrees to each other.

Referring to FIG. 4, the mixer 202a may have a first input, e.g. differential input, coupled to the output of the band-pass filter 201 and a second input coupled to the output of a first one of the pair of outputs of the modulators 210a. The mixer 202a is configured to mix its first input with its second input by converting a second radio-frequency (RF) band, i.e. RF-2, ranging from 20 MHz to 2000 MHz and preferably ranging from 42 MHz to 1002 MHz, for example, at the first input of the mixer 202a into a first intermediate-frequency (IF) band, i.e. IF-1, ranging from 1 MHz to 50 MHz and preferably ranging from 1 MHz to 9 MHz with a center frequency of substantially 5 MHz, for example, at an output, e.g. differential output, of the mixer 202a based on a frequency of a first one of the first pair of mixing clock signals at the second input of the mixer 202a, which may be subtracted from frequencies within the second radio-frequency (RF) band, i.e. RF-2, so as to obtain frequencies within the first intermediate-frequency (IF) band, i.e. IF-1, when the second radio-frequency (RF) band, i.e. RF-2, has a center frequency higher than the frequency of the first one of the first pair of mixing clock signals. Alternatively, frequencies within the second radio-frequency (RF) band, i.e. RF-2, may be subtracted from the frequency of the first one of the first pair of mixing clock signals so as to obtain frequencies within the first intermediate-frequency (IF) band, i.e. IF-1, when the second radio-frequency (RF) band, i.e. RF-2, has a center frequency less than the frequency of the first one of the first pair of mixing clock signals. The second radio-frequency (RF) band, i.e. RF-2, may have an upper limit substantially equal to an upper limit of the first radio-frequency (RF) band, i.e. RF-1, and above upper and lower limits of the first intermediate-frequency (IF) band, i.e. IF-1. The second radio-frequency (RF) band, i.e. RF-2, may have a lower limit substantially equal to a lower limit of the first radio-frequency (RF) band, i.e. RF-1, and above the upper and lower limits of the first intermediate-frequency (IF) band, i.e. IF-1. Accordingly, the mixer 202a may generate a first intermediate-frequency (IF) signal, e.g. differential signal, having frequencies within the first intermediate-frequency band, i.e. IF-1, transmitted from the output of the mixer 202a to the amplifier 203a.

Referring to FIG. 4, the mixer 202b may have a first input, e.g. differential input, coupled to the output of the band-pass filter 201 and a second input coupled to the output of a second one of the first pair of outputs of the modulators 210a. The mixer 202b is configured to mix its first input with its second input by converting a third radio-frequency (RF) band, i.e. RF-3, ranging from 20 MHz to 2000 MHz and preferably ranging from 42 MHz to 1002 MHz, for example, at the first input of the mixer 202b into a second intermediate-frequency (IF) band, i.e. IF-2, ranging from 1 MHz to 50 MHz and preferably ranging from 1 MHz to 9 MHz with a center frequency of substantially 5 MHz, for example, at an output, e.g. differential output, of the mixer 202b based on a frequency of a second one of the first pair of mixing clock signals at the second input of the mixer 202b, which may be subtracted from frequencies within the third radio-frequency (RF) band, i.e. RF-3, so as to obtain frequencies within the second intermediate-frequency (IF) band, i.e. IF-2, when the third radio-frequency (RF) band, i.e. RF-3, has a center frequency higher than the frequency of the second one of the first pair of mixing clock signals. Alternatively, frequencies within the third radio-frequency (RF) band, i.e. RF-3, may be subtracted from the frequency of the second one of the first pair of mixing clock signals so as to obtain frequencies within the second intermediate-frequency (IF) band, i.e. IF-2, when the third radio-frequency (RF) band, i.e. RF-3, has a center frequency less than the frequency of the second one of the first pair of mixing clock signals. The third radio-frequency (RF) band, i.e. RF-3, may have an upper limit substantially equal to an upper limit of the first radio-frequency (RF) band, i.e. RF-1, and the upper limit of the second radio-frequency (RF) band, i.e. RF-2, and above upper and lower limits of the second intermediate-frequency (IF) band, i.e. IF-2, and the upper and lower limits of the first intermediate-frequency (IF) band, i.e. IF-1. The third radio-frequency (RF) band, i.e. RF-3, may have a lower limit substantially equal to a lower limit of the first radio-frequency (RF) band, i.e. RF-1, and the lower limit of the second radio-frequency (RF) band, i.e. RF-2, and above the upper and lower limits of the second intermediate-frequency (IF) band, i.e. IF-2 and the upper and lower limits of the first intermediate-frequency (IF) band, i.e. IF-1. Accordingly, the mixer 202b may generate a second intermediate-frequency (IF) signal, e.g. differential signal, having frequencies within the second intermediate-frequency band, i.e. IF-2, transmitted from the output of the mixer 202b to the amplifier 203b. The first and second intermediate-frequency (IF) signals generated by the respective mixers 202a and 202b may have a phase difference of substantially 90 degrees to each other.

Referring to FIG. 4, the variable-gain amplifier 203a may have an input, e.g. differential input, coupled to the first intermediate-frequency (IF) signal transmitted from the mixer 202a and is configured to amplify its input into an output, e.g. differential output, of the amplifier 203a. The amplifier 203b may have an input, i.e. differential input, coupled to the second intermediate-frequency (IF) signal transmitted from the mixer 202b and is configured to amplify its input into an output, i.e. differential output, of the amplifier 203b.

Referring to FIG. 4, the image reject filter 204 may have a first input, e.g. differential input, coupled to the first intermediate-frequency (IF) signal at the output of the amplifier 203a and a second input, e.g. differential input, coupled to the second intermediate-frequency (IF) signal at the output of the amplifier 203b. The image reject filter 204 is configured to perform filtering on the first intermediate-frequency (IF) signal so as to attenuate an image part, i.e. unwanted part, of its first input and pass a real part, i.e. wanted part, of its first input into a first image-rejected signal, e.g. differential signal, and perform filtering on the second intermediate-frequency (IF) signal so as to attenuate an image part, i.e. unwanted part, of its second input and pass a real part, i.e. wanted part, of its second input into a second image-rejected signal, e.g. differential signal. Next, the image reject filter 204 may shift a phase of the first image-rejected signal and/or a phase of the second image-rejected signal such that the first image-rejected signal may be substantially in phase with the second image-rejected signal to be combined with the first image-rejected signal into an output, e.g. differential output, of the image reject filter 204.

Referring to FIG. 4, the band-pass filter 205 may have an input, e.g. differential input, coupled to the output of the image reject filter 204 and is configured to pass its input at frequencies within a third intermediate-frequency (IF) band, i.e. IF-3, ranging from 1 MHz to 50 MHz and preferably ranging from 1 MHz to 9 MHz with a center frequency of substantially 5 MHz, for example, and attenuate its input at frequencies outside the third intermediate-frequency (IF) band, i.e. IF-3, into an output, e.g. differential output, of the band-pass filter 205. The third intermediate-frequency (IF) band, i.e. IF-3, may have an upper limit substantially equal to that of the first intermediate-frequency (IF) band, i.e. IF-1, and that of the second intermediate-frequency (IF) band, i.e. IF-2. The third intermediate-frequency (IF) band, i.e. IF-3, may have a lower limit substantially equal to that of the first intermediate-frequency (IF) band, i.e. IF-1, and that of the second intermediate-frequency (IF) band, i.e. IF-2. The variable-gain amplifier 206 may have an input, e.g. differential input, coupled to the output of the band-pass filter 205 and is configured to amplify its input into an output, e.g. differential output, of the variable-gain amplifier 206 based on instructions from the demodulator 24. The demodulator 24 as shown in FIG. 2 may have an input, e.g. differential input, coupled to the output of the variable-gain amplifier 206 and is configured to demodulate its input into an output, e.g. differential output, of the demodulator 24 to be displayed on the display panel 25.

Referring to FIG. 4, the power detector 207 may have a first input, e.g. differential input, coupled to the output of the amplifier 200, a second input, e.g. differential input, coupled to the output of the amplifier 203a and a third input, e.g. differential input, coupled to the output of the amplifier 203b. The power detector 207 is configured to detect a first power at its first input so as to generate a first output based on the first power, and the amplifier 200 is configured to amplify its input into the output of the amplifier 200 based on the first output of the power detector 207. The power detector 207 is configured to detect a second power at its second input so as to generate a second output based on the second power, and the amplifier 203a is configured to amplify its input into the output of the amplifier 203a based on the second output of the power detector 207. The power detector 207 is configured to detect a third power at its third input so as to generate a third output based on the third power, and the amplifier 203b is configured to amplify its input into the output of the amplifier 203b based on the third output of the power detector 207.

Figure 5:
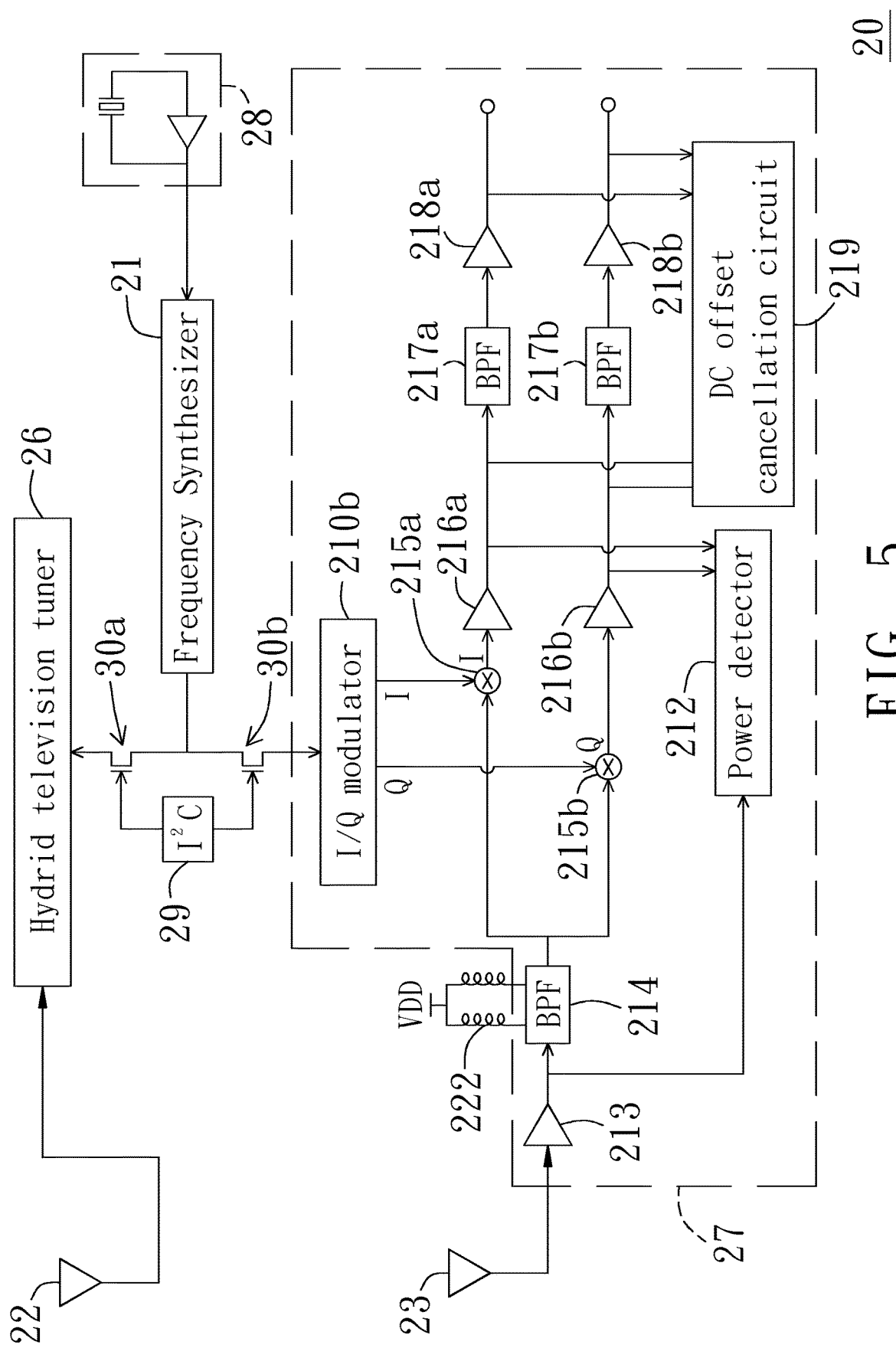
FIG. 5 is a block diagram illustrating the universal tuning module and components of the satellite television tuner in accordance with an embodiment of the present invention.

FIG. 5 is a block diagram illustrating the universal tuning module and components of the satellite television tuner in accordance with an embodiment of the present invention. Referring to FIGS. 3 and 5, the satellite television tuner 27 may include (1) a low noise amplifier 213, e.g. single-ended-to-differential amplifier, arranged downstream of the receiving terminal 23, (2) a band-pass filter (BPF) 214 arranged downstream of the amplifier 213, (3) a pair of mixers 215a and 215b, i.e. frequency-down converters, arranged in parallel and downstream of the band-pass filter (BPF) 214, (4) a pair of variable-gain amplifiers 216a and 216b, e.g. differential-to-differential amplifiers, arranged in parallel and downstream of the pair of mixers 215a and 215b respectively, (5) a pair of band-pass filters 217a and 217b arranged in parallel and downstream of the pair of amplifiers 216a and 216b respectively, (6) a pair of variable-gain amplifiers 218a and 218b, e.g. differential-to-differential amplifiers, arranged in parallel and downstream of the pair of band-pass filters 217a and 217b respectively, (7) a modulator 210b, e.g. in-phase and quadrature (I/Q) modulator, arranged downstream of the switch 30b and upstream of the pair of mixers 215a and 215b, (8) a power detector 212 coupled to outputs of the amplifiers 213, 216a and 216b, and (9) a direct-current (DC) offset cancellation circuit 219 arranged downstream of the variable-gain amplifiers 218a and 218b and with multiple outputs coupled to inputs of the pair of band-pass filters 217a and 217b.

Referring to FIG. 5, the low noise amplifier 213 may have an input coupled to the second television signal transmitted from the receiving terminal 23 and is configured to amplify its input into an output, e.g. differential output with a phase difference of substantially 180 degrees to each other, of the amplifier 213. The band-pass filter 214 may have an input, e.g. differential input, coupled to the output of the amplifier 213 and is configured to pass its input at frequencies within a fourth radio-frequency (RF) band, i.e. RF-4, ranging from 950 MHz to 2150 MHz, for example, and attenuate its input at frequencies outside the fourth radio-frequency (RF) band, i.e. RF-4, into an output, e.g. differential output, of the band-pass filter 214. The universal tuning module may further include multiple inductors 222 coupled between a power source VDD and the band-pass filter 214 so as to reduce a background noise.

Referring to FIGS. 3 and 5, the modulator 210b may have an input coupled to the output of the phase-lock-loop (PLL) circuit 208 of the frequency synthesizer 21 through the switch 30b and is configured to modulate the synthesized clock signal generated by the phase-lock-loop (PLL) circuit 208 and passed by the switch 30b into a second pair of mixing clock signals, e.g. in-phase and quadrature (I/Q) modulated signals, at a pair of outputs of the modulator 210b. The second pair of mixing clock signals may be transmitted from the modulator 210b to the respective mixers 215a and 215b. The second pair of mixing clock signals may have substantially the same frequency as that of the synthesized clock signal generated by the phase-lock-loop (PLL) circuit 208 and passed by the switch 30b and have a phase difference of substantially 90 degrees to each other.

Referring to FIG. 5, the mixer 215a may have a first input, e.g. differential input, coupled to the output of the band-pass filter 214 and a second input coupled to the output of a first one of the pair of outputs of the modulators 210b. The mixer 215a is configured to mix its first input with its second input by converting a fifth radio-frequency (RF) band, i.e. RF-5, ranging from 950 MHz to 2150 MHz, for example, at the first input of the mixer 215a into a fourth intermediate-frequency (IF) band, i.e. IF-4, ranging from −30 MHz to 30 MHz with a center frequency of substantially 0 MHz, for example, at an output, e.g. differential output, of the mixer 215a based on a frequency of a first one of the second pair of mixing clock signals at the second input of the mixer 215a, which may be subtracted from frequencies within the fifth radio-frequency (RF) band, i.e. RF-5, so as to obtain frequencies within the fourth intermediate-frequency (IF)

band, i.e. IF-4. Alternatively, frequencies within the fifth radio-frequency (RF) band, i.e. RF-5, may be subtracted from the frequency of the first one of the second pair of mixing clock signals so as to obtain frequencies within the fourth intermediate-frequency (IF) band, i.e. IF-4. The fifth radio-frequency (RF) band, i.e. RF-5, may have a center frequency substantially equal to the frequency of the first one of the second pair of mixing clock signals. The fifth radio-frequency (RF) band, i.e. RF-5, may have an upper limit substantially equal to an upper limit of the fourth radio-frequency (RF) band, i.e. RF-4, and above absolute values of upper and lower limits of the fourth intermediate-frequency (IF) band, i.e. IF-4. The fifth radio-frequency (RF) band, i.e. RF-5, may have a lower limit substantially equal to a lower limit of the fourth radio-frequency (RF) band, i.e. RF-4, and above the absolute values of the upper and lower limits of the fourth intermediate-frequency (IF) band, i.e. IF-4. Accordingly, the mixer 215a may generate a third intermediate-frequency (IF) signal, e.g. differential signal, having frequencies within the fourth intermediate-frequency band, i.e. IF-4, transmitted from the output of the mixer 215a to the amplifier 216a.

Referring to FIG. 5, the mixer 215b may have a first input, e.g. differential input, coupled to the output of the band-pass filter 214 and a second input coupled to the output of a second one of the pair of outputs of the modulators 210b. The mixer 215b is configured to mix its first input with its second input by converting a sixth radio-frequency (RF) band, i.e. RF-6, ranging from 950 MHz to 2150 MHz, for example, at the first input of the mixer 215b into a fifth intermediate-frequency (IF) band, i.e. IF-5, ranging from −30 MHz to 30 MHz with a center frequency of substantially 0 MHz, for example, at an output, e.g. differential output, of the mixer 215b based on a frequency of a second one of the second pair of mixing clock signals at the second input of the mixer 215b, which may be subtracted from frequencies within the sixth radio-frequency (RF) band, i.e. RF-6, so as to obtain frequencies within the fifth intermediate-frequency (IF) band, i.e. IF-5. Alternatively, frequencies within the sixth radio-frequency (RF) band, i.e. RF-6, may be subtracted from the frequency of the second one of the second pair of mixing clock signals so as to obtain frequencies within the fifth intermediate-frequency (IF) band, i.e. IF-5. The sixth radio-frequency (RF) band, i.e. RF-6, may have a center frequency substantially equal to the frequency of the second one of the second pair of mixing clock signals. The sixth radio-frequency (RF) band, i.e. RF-6, may have an upper limit substantially equal to an upper limit of the fourth radio-frequency (RF) band, i.e. RF-4, and the upper limit of the fifth radio-frequency (RF) band, i.e. RF-5, and above absolute values of upper and lower limits of the fifth intermediate-frequency (IF) band, i.e. IF-5, and the absolute values of the upper and lower limits of the fourth intermediate-frequency (IF) band, i.e. IF-4. The sixth radio-frequency (RF) band, i.e. RF-6, may have a lower limit substantially equal to a lower limit of the fourth radio-frequency (RF) band, i.e. RF-4, and the lower limit of the fifth radio-frequency (RF) band, i.e. RF-5, and above the absolute values of the upper and lower limits of the fifth intermediate-frequency (IF) band, i.e. IF-5 and the absolute values of the upper and lower limits of the fourth intermediate-frequency (IF) band, i.e. IF-4. Accordingly, the mixer 215b may generate a fourth intermediate-frequency (IF) signal, e.g. differential signal, having frequencies within the fifth intermediate-frequency band, i.e. IF-5, transmitted from the output of the mixer 215b to the amplifier 216b. The third and fourth intermediate-frequency (IF) signals generated by the respective mixers 215a and 215b may have a phase difference of substantially 90 degrees to each other.

Referring to FIG. 5, the variable-gain amplifier 216a may have an input, e.g. differential input, coupled to the third intermediate-frequency (IF) signal transmitted from the mixer 215a and is configured to amplify its input into an output, e.g. differential output, of the amplifier 216a. The amplifier 216b may have an input, e.g. differential input, coupled to the fourth intermediate-frequency (IF) signal transmitted from the mixer 215b and is configured to amplify its input into an output, e.g. differential output, of the amplifier 216b.

Referring to FIG. 5, the band-pass filter 217a may have an input, e.g. differential input, coupled to the output of the amplifier 216a and is configured to pass its input at frequencies within a sixth intermediate-frequency (IF) band, i.e. IF-6, ranging from −30 MHz to 30 MHz for example, and attenuate its input at frequencies outside the sixth intermediate-frequency (IF) band, i.e. IF-6, into an output, e.g. differential output, of the band-pass filter 217a. The sixth intermediate-frequency (IF) band, i.e. IF-6, may have an upper limit substantially equal to that of the fourth intermediate-frequency (IF) band, i.e. IF-4, and that of the fifth intermediate-frequency (IF) band, i.e. IF-5. The sixth intermediate-frequency (IF) band, i.e. IF-6, may have a lower limit substantially equal to that of the fourth intermediate-frequency (IF) band, i.e. IF-4, and that of the fifth intermediate-frequency (IF) band, i.e. IF-5.

Referring to FIG. 5, the band-pass filter 217b may have an input, e.g. differential input, coupled to the output of the amplifier 216b and is configured to pass its input at frequencies within a seventh intermediate-frequency (IF) band, i.e. IF-7, ranging from −30 MHz to 30 MHz for example, and attenuate its input at frequencies outside the seventh intermediate-frequency (IF) band, i.e. IF-7, into an output, e.g. differential output, of the band-pass filter 217b. The seventh intermediate-frequency (IF) band, i.e. IF-7, may have an upper limit substantially equal to that of the fourth intermediate-frequency (IF) band, i.e. IF-4, that of the fifth intermediate-frequency (IF) band, i.e. IF-5 and that of the sixth intermediate-frequency (IF) band, i.e. IF-6. The seventh intermediate-frequency (IF) band, i.e. IF-7, may have a lower limit substantially equal to that of the fourth intermediate-frequency (IF) band, i.e. IF-4, that of the fifth intermediate-frequency (IF) band, i.e. IF-5 and that of the sixth intermediate-frequency (IF) band, i.e. IF-6.

Referring to FIG. 5, the variable-gain amplifier 218a may have an input, e.g. differential input, coupled to the output of the band-pass filter 217a and is configured to amplify its input into an output, e.g. differential output, of the amplifier 218a based on instructions from the demodulator 24. The variable-gain amplifier 218b may have an input, e.g. differential input, coupled to the output of the band-pass filter 217b and is configured to amplify its input into an output, e.g. differential output, of the amplifier 218b based on instructions from the demodulator 24. The demodulator 24 as shown in FIG. 2 may have a pair of inputs, e.g. differential inputs, coupled to the outputs of the amplifiers 218a and 218b respectively and is configured to demodulate its pair of inputs into an output of the demodulator 24 to be displayed on the display panel 25.

Referring to FIG. 5, the power detector 212 may have a first input, e.g. differential input, coupled to the output of the amplifier 213, a second input, e.g. differential input, coupled to the output of the amplifier 216a and a third input, e.g. differential input, coupled to the output of the amplifier 216b. The power detector 212 is configured to detect a fourth power at its first input so as to generate a first output based on the fourth power, and the amplifier 213 is configured to amplify its input into the output of the amplifier 213 based on the first output of the power detector 212. The power detector 212 is configured to detect a fifth power at its second input so as to generate a second output based on the fifth power, and the amplifier 216a is configured to amplify its input into the output of the amplifier 216a based on the second output of the power detector 212. The power detector 212 is configured to detect a sixth power at its third input so as to generate a third output based on the sixth power, and the amplifier 216b is configured to amplify its input into the output of the amplifier 216b based on the third output of the power detector 212.

Referring to FIG. 5, the direct-current (DC) offset cancellation circuit 219 may have a first input, e.g. differential input, coupled to the output of the amplifier 218a and a second input, e.g. differential input, coupled to the output of the amplifier 218b. The direct-current offset cancellation circuit 219 is configured to generate a first output, e.g. differential output, to be coupled to the input of the band-pass filter 217a so as to reduce a direct-current (DC) component of the output of the amplifier 218a at its first input. The direct-current offset cancellation circuit 219 is configured to generate a second output, e.g. differential output, to be coupled to the input of the band-pass filter 217a so as to reduce a direct-current (DC) component of the output of the amplifier 218b at its second input. Thereby, the direct-current (DC) offset cancellation circuit 219 may reduce a direct-current (DC) component on signal paths for transmitting the third and fourth intermediate-frequency signals.

Figure 6:
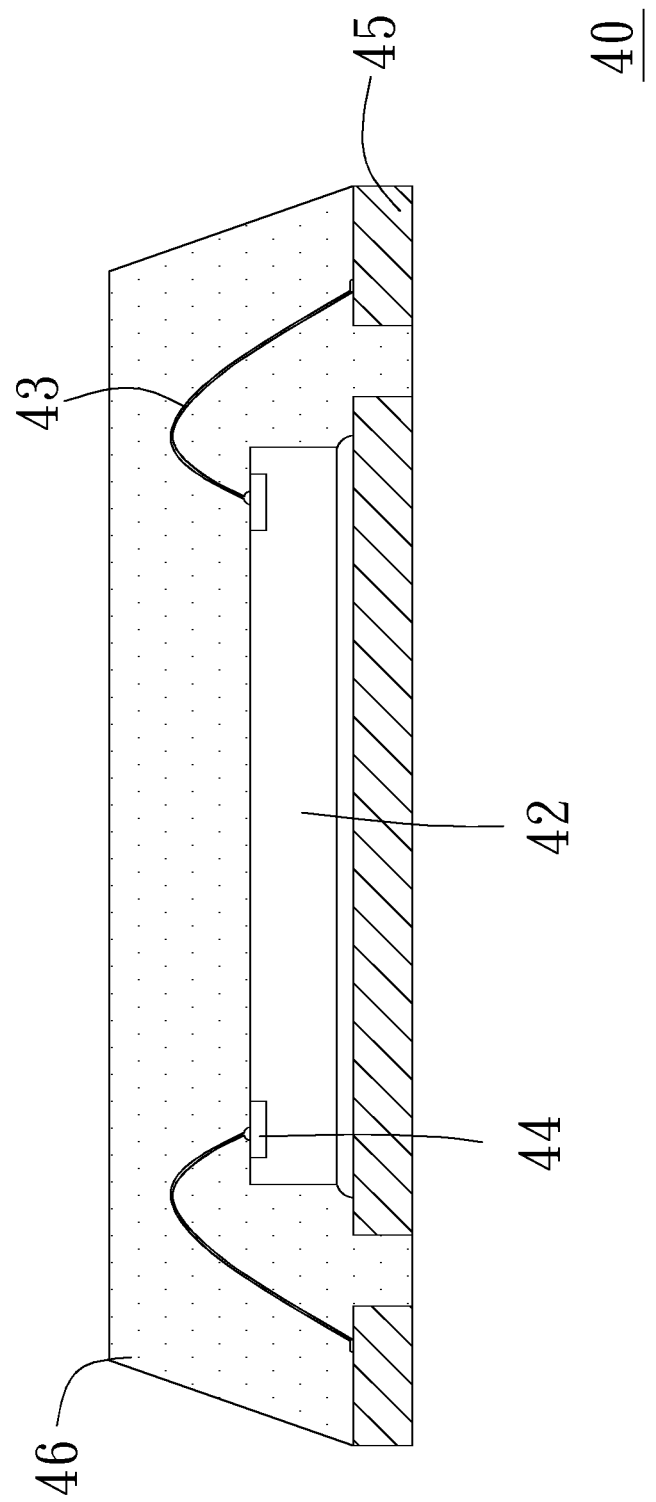
FIG. 6 shows a schematically cross-sectional view of an electronic package for the integrated circuit chip in accordance with an embodiment of the present invention.

FIG. 6 shows a schematically cross-sectional view of an electronic package for the integrated circuit chip in accordance with an embodiment of the present invention. Referring to FIGS. 3, 4, 5 and 6, the hybrid television tuner 26, the satellite television tuner 27, frequency synthesizer 21, switches 30a and 30b and inter-integrated circuit (I²C) 29 may be incorporated or embedded in an integrated circuit chip 42. The integrated circuit chip 42 may include a semiconductor substrate, such as silicon substrate, having its active devices, such as transistors, its passive devices, such as resistors, capacitors and/or inductors, and its conductive traces, such as damascene electroplated copper traces or sputtered aluminum traces, formed on or over the silicon substrate. These active devices, passive devices and conductive traces compose the hybrid television tuner 26, the satellite television tuner 27, frequency synthesizer 21, switches 30a and 30b and inter-integrated circuit (I²C) 29. Another integrated circuit chip is provided with the external oscillator 28.

Referring to FIG. 6, the electronic package 40 may include (1) a lead frame 41, (2) the integrated circuit chip 42 attached to a top surface of the lead frame 42, (3) multiple wirebonded wires 43 each extending across over a corresponding edge of the integrated circuit chip 42 to electrically connect a corresponding metal pad 44 of the integrated circuit chip 42 to a corresponding metal lead or pin 45 of the lead frame 42 and (4) a mold 46 formed over the top surface of the lead frame 41 to encapsulate the integrated circuit chip 42 and the wirebonded wires 43.

Alternatively, referring to FIGS. 3, 4, 5 and 6, the hybrid television tuner 26, the satellite television tuner 27, frequency synthesizer 21, switches 30a and 30b, inter-integrated circuit (I²C) 29 and external oscillator 28 may be incorporated or embedded in a common integrated circuit chip, such as the integrated circuit chip 42.

Figure 7:
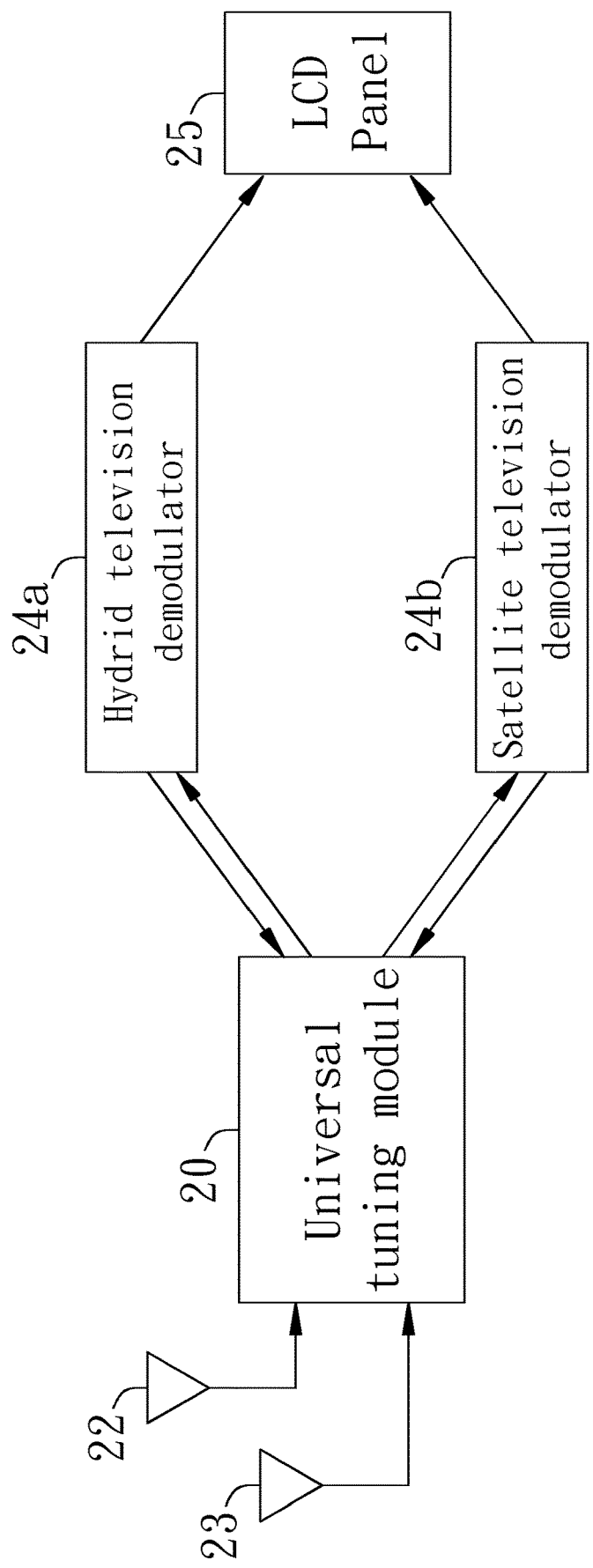
FIG. 7 illustrates a block diagram of a television and satellite receiving system in accordance with another embodiment of the present invention.

FIG. 7 illustrates a block diagram of a television and satellite receiving system in accordance with another embodiment of the present invention. The same reference number illustrated in FIGS. 2-7 indicates elements having the same functions. Referring to FIG. 7, the block diagram is similar to that shown in FIG. 2 except that the demodulator 24 in FIG. 2, provided by an integrated circuit chip, is divided into a hybrid television demodulator 24a and a satellite television demodulator 24b provided by different integrated circuit chips.

Referring to FIGS. 3, 4, 5 and 7, the hybrid television demodulator 24a may have an input, e.g. differential input, coupled to the output of the amplifier 206 of the hybrid television tuner 26 and is configured to demodulate its input into an output, e.g. differential output, of the hybrid television demodulator 24a to be displayed on the display panel 25. The satellite television demodulator 24b may have a pair of inputs, e.g. differential inputs, coupled to the outputs of the amplifiers 218a and 218b of the satellite television tuner 27 respectively and is configured to demodulate its pair of inputs into an output, e.g. differential output, of the satellite television demodulator 24b to be displayed on the display panel 25. The inter-integrated circuit (I²C) 29 is configured to generate the first control signal based on instructions from the hybrid television demodulator 24a to the switch 30a so as to control the switch 30a to be switched on to pass the synthesized clock signal from the phase-lock-loop (PLL) circuit 208 to the hybrid television tuner 26 or to be switched off not to pass the synthesized clock signal from the phase-lock-loop (PLL) circuit 208 to the hybrid television tuner 26, and configured to generate the second control signal based on instructions from the satellite television demodulator 24b to the switch 30b so as to control the switch 30b to be switched on to pass the synthesized clock signal from the phase-lock-loop (PLL) circuit 208 to the satellite television tuner 27 or to be switched off not to pass the synthesized clock signal from the phase-lock-loop (PLL) circuit 208 to the satellite television tuner 27. The amplifier 206 is configured to amplify its input into the output of the amplifier 206 based on instructions from the hybrid television demodulator 24a. The amplifier 218a is configured to amplify its input into the output of the amplifier 218a based on instructions from the satellite television demodulator 24b. The amplifier 218b is configured to amplify its input into the output of the amplifier 218b based on instructions from the satellite television demodulator 24b.

In accordance with the present invention, the hybrid television tuner 26 and satellite television tuner 27 are incorporated in a common integrated circuit chip, and thus space for the hybrid television tuner 26 and satellite television tuner 27 may be saved. The frequency synthesizer 21 may generate the synthesized clock signal to one of the hybrid television tuner 26 and satellite television tuner 27, and thus space for circuits may be saved and interference between signals may be reduced.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A universal tuning module comprising:
    a first hybrid tuner, adapted to receive a first analog signal or first digital signal at an input terminal thereof and generate an IF (intermediate frequency) signal at an output terminal thereof;
    a second tuner, adapted to receive a second digital signal at an input terminal thereof and generate a set of orthogonal signals at two output terminals thereof;
    a switching mechanism, adapted to generate a first on/off control signal and a second on/off control signal to a first switch and a second switch, respectively, and concurrently, control passage of a generated clock signal having a first desired channel or second desired channel to the first hybrid tuner or second tuner, respectively, wherein the concurrent first on/off control signal and the second on/off control signal are opposite signals,
    wherein the first and second tuner each comprise an in-phase (I) mixer and a quadrature (Q) mixer circuit arrangement, each IQ mixer circuit arrangement at least comprising:
        an I/O modulator having a clock signal input and an analog I signal output and an analog Q signal output, adapted to modulate the clock signal having the first desired channel or second desired channel, respectively, generated in accordance with a corresponding frequency reference signal;
        an I mixer having a signal input, a reference signal input, and an IF signal output, receiving a respective filtered signal at the signal input and modulated analog I signal at the reference signal input, and adapted to mix the received signals to IF frequency ranges at the IF signal output, respectively;
        a Q mixer having a signal input, a reference signal input, and an IF signal output, receiving a respective filtered signal at the signal input and modulated analog signal at the reference signal input, and adapted to mix the received signals to IF frequency ranges at the IF signal outputs thereof.

2. The universal tuning module of claim 1, wherein the IQ mixer circuit arrangement of the first hybrid and second tuner, each further comprises:
    an amplifier coupled to the input terminal at a signal output thereof; and
    a band-pass filter (BPF) coupled to the amplifier at the signal output thereof and coupled to the I and Q mixers at signal inputs thereof, respectively; and
    two amplifiers, coupled to the I and Q mixers at IF signal outputs thereof, respectively, each having an IF signal input and an IF signal output, receiving the respective IF frequencies at the IF signal inputs thereof, adapted to calibrate the respective IF frequencies from the I and Q mixers, respectively.

3. The universal tuning module of claim 2, wherein the first hybrid tuner further comprises an image-reject filter, coupled to the two amplifiers coupled to the I and Q mixers at amplified IF signal inputs of the two amplifiers, respectively, a band pass filter coupled to the image-reject filter at an IF signal output thereof, and an amplifier coupled to the band pass filter at an IF signal output thereof, generating an IF signal.

4. The universal tuning module of claim 2, wherein the second tuner further comprises a direct-current (DC) offset cancellation circuit, two band pass filters coupled to the two amplifiers coupled to the I and Q mixers at amplified IF signal outputs of the two amplifiers, respectively, and coupled to the DC offset cancellation circuit, and two amplifiers coupled to the two band pass filters at IF signal outputs thereof, respectively, and coupled to the DC offset cancellation circuit, wherein DC components on coupled conductive paths are reduced and a set of orthogonal signals are generated.

5. The universal tuning module of claim 1, wherein the first analog signal or first digital signal received at the input terminal of the first hybrid tuner is received from a VHF or UHF antenna and the second digital signal received at the input terminal of the second tuner is received from a satellite transmission.

6. The universal tuning module of claim 1, wherein when the first hybrid tuner receives an analog signal, the respective filtered signals received by the I and Q mixers are analog filtered signals.

7. An integrated circuit chip comprising:
    a first hybrid tuner, adapted to receive a first analog signal or first digital signal at an input terminal thereof and generate an IF (intermediate frequency) signal at an output terminal thereof;
    a second tuner, adapted to receive a second digital signal at an input terminal thereof and generate a set of orthogonal signals at two output terminals thereof;
    a phase-lock-loop (PLL) circuit, adapted to generate a dock signal; and
    a switching mechanism coupled to the PLL circuit, adapted to generate a first on/off control signal and a second on/off control signal to a first switch and a second switch, respectively, and concurrently, control passage of the generated clock signal having a first desired channel or second desired channel to the first hybrid tuner or second tuner, respectively, wherein the concurrent first on/off control signal and the second on/off control signal are opposite signals,
    wherein the first and second tuner each comprise an in-phase (I) mixer and a quadrature (Q) mixer circuit arrangement, each circuit arrangement at least comprising:
        an I/O modulator having a clock signal input and an analog I signal output and an analog Q signal output, adapted to modulate the clock signal having the first desired channel or second desired channel, respectively, generated in accordance with a corresponding frequency reference signal;
        an I mixer having a signal input, a reference signal input, and an IF signal output, receiving a respective filtered signal at the signal input and modulated analog I signal at the reference signal input, adapted, to mix the received signals to IF frequency ranges at the IF signal output, respectively;

a Q mixer having a signal input, a reference signal input, and an IF signal output, receiving a respective filtered signal at the signal input and modulated analog signal at the reference signal input, adapted to mix the received signals to IF frequency ranges at the IF signal outputs thereof.

8. The integrated circuit chip of claim 7, wherein the IQ mixer circuit arrangement of the first hybrid and second tuner, each further comprises:
   an amplifier coupled to the input terminal at a signal output thereof; and
   a band-pass filter (BPF) coupled to the amplifier at the signal output thereof and coupled to the I and Q mixers at signal inputs thereof, respectively; and
   two amplifiers, coupled to the I and Q mixers, respectively, each having an IF signal input and an IF signal output, receiving the respective IF frequencies at the IF signal inputs thereof, adapted to calibrate the respective IF frequencies from the I and mixers, respectively.

9. The integrated circuit chip of claim 8, wherein the first hybrid tuner further comprises an image-reject filter, coupled to the two amplifiers coupled to the I and Q mixers at amplified IF signal inputs of the two amplifiers, respectively, a band pass filter coupled to the image-reject filter at an IF signal output thereof, and an amplifier coupled to the band pass filter at an IF signal output thereof, generating an IF signal.

10. The integrated circuit chip of claim 8, wherein the second tuner further comprises a direct-current (DC) offset cancellation circuit, two band pass filters coupled to the two amplifiers coupled to the I and Q mixers at amplified IF signal outputs of the two amplifiers, respectively, and coupled to the DC offset cancellation circuit, and two amplifiers coupled to the two band pass filters at IF signal outputs thereof, respectively, and coupled to the DC offset cancellation circuit, wherein DC components on coupled conductive paths are reduced and a set of orthogonal signals are generated.

11. The integrated circuit chip of claim 7, wherein the first analog signal or first digital signal received at the input terminal of the first hybrid tuner is received from a VHF or UHF antenna and the second digital signal received at the input terminal of the second tuner is received from a satellite transmission.

12. The integrated circuit chip of claim 7, wherein when the first hybrid tuner receives an analog signal, the respective filtered signals received by the I and Q mixers are analog filtered signals.

\* \* \* \* \*